(12) United States Patent
Uehara

(10) Patent No.: US 7,879,970 B2
(45) Date of Patent: Feb. 1, 2011

(54) CONDUCTIVE POLYMER, CONDUCTIVE LAYER, ELECTRONIC DEVICE, AND ELECTRONIC EQUIPMENT

(75) Inventor: Masamltsu Uehara, Shiojri (JP)

(73) Assignee: Seiko Epson Corporation, Tokyo (JP)

( * ) Notice: Subject to any disclaimer, the term of this patent is extended or adjusted under 35 U.S.C. 154(b) by 726 days.

(21) Appl. No.: 11/794,947

(22) PCT Filed: Jan. 10, 2006

(86) PCT No.: PCT/JP2006/300407

§ 371 (c)(1),
(2), (4) Date: Jul. 10, 2007

(87) PCT Pub. No.: WO2006/075723

PCT Pub. Date: Jul. 20, 2006

(65) Prior Publication Data

US 2009/0195145 A1    Aug. 6, 2009

(30) Foreign Application Priority Data

Jan. 11, 2005   (JP) .............................. 2005-003416

(51) Int. Cl.
   *C08F 8/32* (2006.01)
(52) U.S. Cl. .................. 528/332; 257/40; 257/103; 313/506; 428/1.5; 428/917; 430/58.05; 430/58.5; 526/291; 526/346; 526/347; 526/351; 526/352; 528/367; 528/396; 528/423
(58) Field of Classification Search .................. 257/40, 257/103; 313/506; 428/1.5, 917; 430/58.05, 430/58.5; 526/291, 346, 347, 351, 352; 528/332, 528/367, 396, 423
See application file for complete search history.

(56) References Cited

U.S. PATENT DOCUMENTS 5,232,802 A * 8/1993 Rule et al. ............... 430/58.15

(Continued)

FOREIGN PATENT DOCUMENTS

JP    A 8-208745    8/1996

(Continued)

OTHER PUBLICATIONS

Boden et al., "CPI: A Recipe for Improving Applicable Properties of Discotic Liquid Crystals", J. Am. Chem. Soc. 2001, 123, 7915-7916.*

(Continued)

*Primary Examiner*—Vasu Jagannathan
*Assistant Examiner*—Richard A Huhn
(74) *Attorney, Agent, or Firm*—Oliff & Berridge, PLC

(57) ABSTRACT

A conductive polymer having a high carrier transport ability, a conductive layer formed using the conductive polymer, an electronic device provided with the conductive layer having a high reliability, and electronic equipment provided with such an electronic device are provided. The conductive polymer includes a linear main chain, a plurality of carrier transport structures which contribute to carrier transport and each of which is represented by the following formula (1), and a linking structure which branches off from the main chain to link each of the carrier transport structures to the main chain: General Formula (1) where each $R^1$ independently represents a hydrogen atom, a methyl group or an ethyl group, and the $R^1$s are the same or different.

17 Claims, 4 Drawing Sheets

U.S. PATENT DOCUMENTS

| | | | |
|---|---|---|---|
| 5,281,489 A * | 1/1994 | Mori et al. | 428/690 |
| 6,436,559 B1 * | 8/2002 | Ueno et al. | 428/690 |
| 2001/0026879 A1 | 10/2001 | Chen et al. | |
| 2009/0143262 A1 * | 6/2009 | Kawata | 508/256 |

FOREIGN PATENT DOCUMENTS

| | | |
|---|---|---|
| JP | A 8-245726 | 9/1996 |
| JP | A 9-255774 | 9/1997 |
| JP | A 2000-87027 | 3/2000 |
| JP | A 2000-208254 | 7/2000 |
| JP | A 2001-143871 | 5/2001 |
| JP | A 2002-100477 | 4/2002 |
| JP | 2004185967 A * | 7/2004 |
| JP | A 2004-185967 | 7/2004 |
| JP | A 2005-116238 | 4/2005 |

OTHER PUBLICATIONS

Budd et al., "A nanoporous network polymer derived from hexaazatrinaphthylene with potential as an adsorbent and catalyst support", J. Mater. Chem. 2003, 13(11), 2721-2726.*

Terrell et al., "The Dependence of the Glass Transition Temperature of Poly( N-vinylcarbazole) upon Steric Microstructure and Molecular Weight", J. Polym. Sci. 1982, 20(10), 1933-1945.*

* cited by examiner

CONDUCTIVE POLYMER, CONDUCTIVE LAYER, ELECTRONIC DEVICE, AND ELECTRONIC EQUIPMENT

CROSS-REFERENCE

The entire disclosure of Japanese Patent Application No. 2005-003416 filed on Jan. 11, 2005 is expressly incorporated by reference herein.

BACKGROUND OF THE INVENTION

1. Field of the Invention

The present invention relates to a conductive polymer, a conductive layer, an electronic device, and electronic equipment, and more specifically to a conductive polymer having a high carrier transport ability, a conductive layer formed using the conductive polymer as a main material, an electronic device provided with the conductive layer and having a high reliability, and electronic equipment provided with the electronic device.

2. Description of Prior Art

Electroluminescent devices using organic materials (hereinafter, simply referred to as an "organic EL device") have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

At this time, in a case where the molecular structure or molecular aggregation state of an organic EL material (hereinafter, also referred to as a "light emitting layer material") is in a specific state, the injected electrons and the injected holes are not combined immediately, and a specific excited state is maintained for a certain time. As a result, the total energy of molecules becomes higher than that in a normal state, that is, a ground state by excitation energy. A pair of an electron and a hole in such a special excited state is called as an exciton.

When the exciton decays after the excited state thereof is maintained for a certain time, an electron and a hole are combined so that the increased energy, that is, the excitation energy is emitted as heat or light to the outside.

Such light emission occurs near the light emitting layer. The proportion of the excitation energy that is emitted as light to the total excitation energy is greatly influenced by the molecular structure or molecular aggregation state of the organic EL material.

Further, it has been found that a device structure, in which organic layers formed of organic materials having different carrier transport properties for electrons or holes from that for the light emitting layer is provided between the light emitting layer and the cathode and/or the anode, is effective in obtaining an organic EL device having a high light emitting efficiency.

Therefore, in order to obtain an organic EL device having a high light emitting efficiency, it is absolutely necessary to improve the molecular structure or molecular aggregation state of the light emitting layer material and a carrier transport layer material for transporting electrons or holes.

In addition, as described above, it is necessary to laminate a light emitting layer and organic layers having different carrier transport properties with each other (hereinafter, these layers are collectively referred to as "organic layers") on the electrode. However, in the conventional manufacturing method using an application method, when such organic layers are laminated, mutual dissolution occurs between the adjacent organic layers, thereby causing a problem in that the characteristics of a resultant organic EL device, such as light emitting efficiency, color purity of luminescent color, and pattern accuracy are deteriorated.

Therefore, in the case where such organic layers are laminated, these organic layers have to be formed using organic materials having different solubilities in order to prevent the adjacent organic layers from being mutually dissolved.

In order to solve such a problem, a method for improving the durability of a lower organic layer, that is, the solvent resistance of the lower organic layer has been disclosed (see, for example, JP-A No. 09-255774). In this method, organic materials constituting the lower organic layer are polymerized to improve the solvent resistance of the lower organic layer.

Another method for improving the solvent resistance of a lower organic layer is found in JP-A No. 2000-208254. This publication discloses a method in which a curing resin is added to an organic material constituting the lower organic layer to cure the organic material together with the curing resin.

However, even in the case where such a method is employed in manufacturing an organic EL device, the characteristics of the resultant organic EL device are not so improved as to meet expectations in actuality.

SUMMARY OF THE INVENTION

It is therefore an object of the present invention to provide a conductive polymer having a high carrier transport ability, a conductive layer formed using the conductive polymer, an electronic device provided with the conductive layer and having a high reliability, and electronic equipment provided with such an electronic device.

In order to achieve the above-mentioned object, the present invention is directed to a conductive polymer. The conductive polymer comprises a linear main chain, a plurality of carrier transport structures which contribute to carrier transport and each of which is represented by the following general formula (1), and a linking structure which branches off from the main chain to link each of the carrier transport structures to the main chain:

General Formula (1)

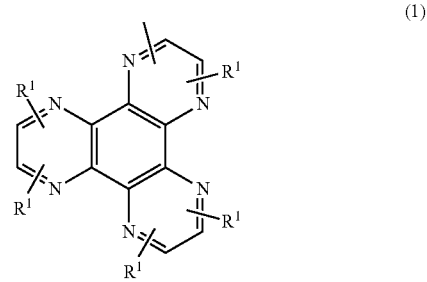

where each $R^1$ independently represents a hydrogen atom, a methyl group or an ethyl group, and the $R^1$s are the same or different.

According to the present invention described above, it is possible to provide a conductive polymer having a high carrier transport ability.

Another aspect of the present invention is also directed to a conductive polymer. The conductive polymer comprises a linear main chain, a plurality of carrier transport structures which contribute to carrier transport and each of which is represented by the following general formula (2), and a linking structure which branches off from the main chain to link each of the carrier transport structures to the main chain:

General Formula (2)

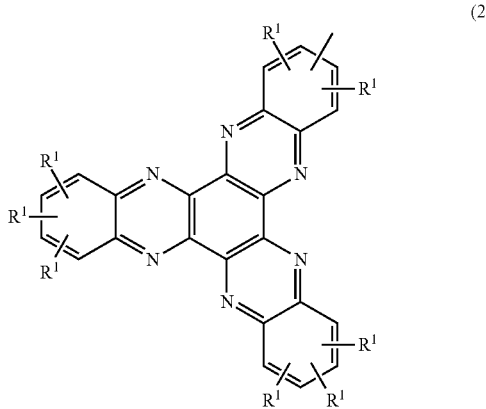

(2)

where each $R^1$ independently represents a hydrogen atom, a methyl group or an ethyl group, and the $R^1$s are the same or different.

According to the present invention described above, it is also possible to provide a conductive polymer having a high carrier transport ability.

In the above-mentioned conductive polymer, it is preferred that each carrier transport structure has a benzene ring, and each linking structure is linked to 2- or 3-position on the benzene ring.

According to this structure, variations in interval between the adjacent carrier transport structures from place to place in the conductive polymer is further reduced, thereby reducing the polarization of electron density in the conductive polymer and further enhancing the carrier transport ability of the conductive polymer.

In the conductive polymer according to the present invention, it is preferred that when the number of atoms linearly linked to each other to constitute the main chain existing between the adjacent linking structures is defined as "A" and the number of atoms linearly linked to each other in the linking structure is defined as "B", A and B satisfy the relation $1 \leq A/B \leq 10$.

By allowing A and B to satisfy such a relation, it is possible to keep the interval between the adjacent carrier transport structures appropriately, thereby enabling to prevent the occurrence of interaction between the adjacent carrier transport structures reliably. Further, transfer of holes between the carrier transport structures can be performed reliably. With these results, the hole transport ability of the conductive polymer is enhanced.

Further, in the conductive polymer according to the present invention, it is preferred that the number of atoms linearly linked to each other to constitute the main chain existing between the adjacent linking structures is 3 to 10.

This also makes it possible to prevent the occurrence of interaction between the adjacent carrier transport structures more reliably. Further, transfer of holes between the carrier transport structures can be performed more reliably. With these results, the hole transport ability of the conductive polymer is further enhanced.

Further, in the conductive polymer according to the present invention, it is preferred that the number of atoms linearly linked to each other in each of the adjacent linking structures is substantially the same as to each other.

This makes it possible to reduce variations in the interval between the adjacent carrier transport structures. As a result, polarization of electron density in the conductive polymer is reduced, thereby enabling to further enhance the hole transport ability of the conductive polymer.

Further, in the conductive polymer according to the present invention, it is preferred that the number of atoms linearly linked to each other to constitute the main chain is in the range of 100 to 30,000.

By allowing the conductive polymer to have such a relatively long main chain, it is possible to prevent adjacent conductive polymers from unnecessarily coming close to each other when the conductive layer is formed. This makes it possible to prevent the occurrence of interaction between the carrier transport structures of the adjacent conductive polymers, thereby enabling to enhance the carrier transport ability of the conductive layer.

Furthermore, in the conductive polymer according to the present invention, it is preferred that the main chain is mainly composed of a saturated hydrocarbon.

Since a saturated hydrocarbon has high insulation properties, it is possible to prevent appropriately carriers from moving between the adjacent carrier transport structures via the main chain, that is, it is possible to prevent the occurrence of interaction between the adjacent carrier transport structures via the main chain appropriately.

Furthermore, in the conductive polymer according to the present invention, it is preferred that the main chain contains between the adjacent linking structures a side chain that branches off from the main chain and has a double bond.

According to this structure, even if the interval between the adjacent carrier transport structures is relatively long, holes are transferred between the adjacent carrier transport structures via π electrons of the double bond. As a result, it is possible to prevent or suppress a hole transport ability of the conductive polymer from being decreased due to increased interval between the adjacent carrier transport structures.

Moreover, in the conductive polymer according to the present invention, it is preferred that the number of atoms linearly linked to each other to constitute each linking structure is 1 to 5.

According to this structure, it is possible to keep the interval between the carrier transport structures appropriately. This makes it possible to prevent the occurrence of interaction between the adjacent carrier transport structures more reliably. Further, transfer of holes between the carrier transport structures can be performed more reliably. With these results, the hole transport ability of the conductive polymer is further enhanced.

Moreover, in the conductive polymer according to the present invention, it is preferred that each linking structure contains an amide bond.

An amide bond formation reaction is highly reactive, and therefore it is possible to link each carrier transport structure to the main chain reliably when the conductive polymer is synthesized (produced), thereby enabling to obtain a desired conductive polymer with reliability.

Other aspect of the present invention is directed to a conductive layer formed using the conductive polymer mentioned above.

According to the invention mentioned above, it is possible to form a conductive layer having a high carrier transport ability reliably.

In this case, it is preferred that the conductive layer is formed by means of an application method. This makes it possible to form a conductive layer having a high carrier transport ability reliably.

Further, it is also preferred that the conductive layer is used for a hole transport layer. Such a hole transport layer can also have a high hole transport ability.

In this case, it is preferred that the average thickness of the hole transport layer is in the range of 1 to 100 nm. This makes it possible to form a conductive layer having a high transparency with no pin hole.

The other aspect of the present invention is directed to an electronic device comprising a laminated body which includes the conductive layer described above. Such an electronic device can also have a high reliability.

In this case, it is preferred that the electronic device includes a light emitting device or a photoelectric transducer. These light emitting device and photoelectric transducer can have a high reliability.

Further, it is also preferred that the light emitting device includes an organic electroluminescent device. Such an organic electroluminescent device can also have a high reliability.

Yet other aspect of the present invention is directed to electronic equipment comprising the electronic device described above. Such electronic equipment can also have a high reliability.

These and other objects, structures and advantages of the present invention will be apparent from the following detailed description of the invention and the examples thereof which proceeds with reference to the accompanying drawings.

BEST MODE FOR CARRYING OUT THE INVENTION

Hereinbelow, a conductive polymer, a conductive layer, an electronic device, and electronic equipment according to the present invention will be described in detail with reference to the preferred embodiments shown in the accompanying drawings.

<Organic Electroluminescent Device>

First, an embodiment in which an electronic device according to the present invention is applied to an organic electroluminescent device (hereinafter, simply referred to as an "organic EL device") will be described.

Figure 1:
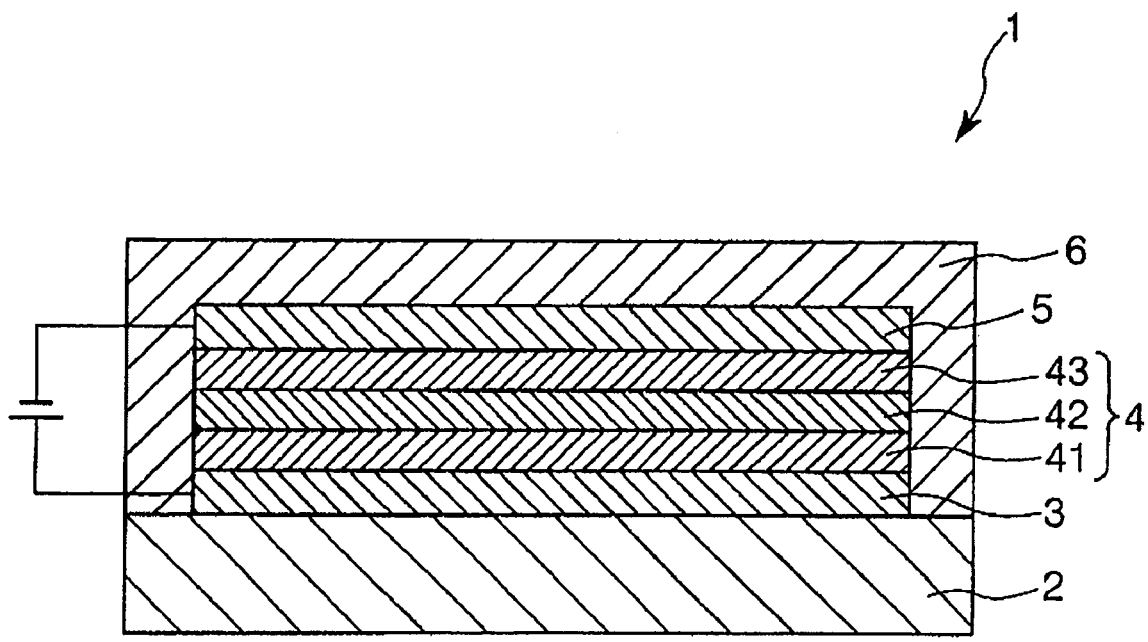
FIG. 1 is a cross-sectional view which shows an example of an organic EL device.

FIG. 1 is a cross-sectional view which shows an example of an organic EL device.

The organic EL device 1 shown in FIG. 1 includes a transparent substrate 2, an anode 3 provided on the substrate 2, an organic EL layer 4 provided on the anode 3, a cathode 5 provided on the organic EL layer 4, and a protection layer 6 provided so as to cover these layers 3, 4 and 5.

The substrate 2 serves as a support of the organic EL device 1, and the layers described above are formed on this substrate 2.

As a constituent material of the substrate 2, a material having a light transmitting property and a good optical property can be used.

Examples of such a material include various resin materials such as polyethylene terephthalate, polyethylene naphthalate, polypropylene, cycloolefin polymer, polyamide, polyether sulfone, polymethylmethacrylate, polycarbonate, and polyarylate, various glass materials, and the like. These materials can be used singly or in combination of two or more of them.

The thickness of the substrate 2 is not limited to any specific value, but is preferably in the range of about 0.1 to 30 mm, more preferably in the range of about 0.1 to 10 mm.

The anode 3 is an electrode which injects holes into the organic EL layer 4 (that is, into a hole transport layer 41 described later). Further, this anode 3 is made substantially transparent (which includes colorless and transparent, colored and transparent, or translucent) so that light emission from the organic EL layer 4 (that is, from a light emitting layer 42 described later) can be visually identified.

From such a viewpoint, a material having a high work function, excellent conductivity and a light transmitting property is preferably used as a constituent material of the anode 3 (hereinafter, referred to as "anode material").

Examples of such an anode material include oxides such as ITO (Indium Tin Oxide), $SnO_2$, Sb-containing $SnO_2$ and Al-containing ZnO, Au, Pt, Ag, Cu, and alloys containing two or more of them. These materials can be used singly or in combination of two or more of them.

The thickness of the anode 3 is not limited to any specific value, but is preferably in the range of about 10 to 200 nm, more preferably in the range of about 50 to 150 nm. If the thickness of the anode 3 is too thin, there is a possibility that a function as the anode 3 is not sufficiently exhibited. On the other hand, if the anode 3 is too thick, there is a possibility that light transmittance is significantly lowered depending on, for example, the kind of anode material used, thus resulting in an organic EL device that can not be suitably used for practical use.

It is to be noted that conductive resins such as polythiophene, polypyrrole, and the like can also be used for the anode material, for example.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys containing two or more of them. These materials can be used singly or in combination of two or more of them.

Particularly, in a case where an alloy is used as a cathode material, an alloy containing a stable metallic element such as Ag, Al, or Cu, specifically an alloy such as MgAg, AlLi, or CuLi is preferably used. The use of such an alloy as the cathode material makes it possible to improve the electron injection efficiency and stability of the cathode 5.

The thickness of the cathode 5 is preferably in the range of about 1 nm to 1 μm, more preferably in the range of about 100 to 400 nm. If the thickness of the cathode 5 is too thin, there is a possibility that a function as the cathode 5 is not sufficiently exhibited. On the other hand, if the cathode 5 is too thick, there is a possibility that the light emitting efficiency of the organic EL device 1 is lowered.

Between the anode 3 and the cathode 5, there is provided the organic EL layer 4. The organic EL layer 4 includes the hole transport layer 41, the light emitting layer 42, and the electron transport layer 43. These layers 41, 42 and 43 are formed on the anode 3 in this order.

The hole transport layer 41 (that is, the conductive layer according to the present invention) has the function of transporting holes, which are injected from the anode 3, to the light emitting layer 42.

The hole transport layer 41 is mainly composed of the conductive polymer according to the present invention.

The conductive polymer according to the present invention includes a linear main chain, a plurality of carrier transport structures which contribute to carrier transport and each of which is represented by the following general formula (1) or the following general formula (2) (hereinafter, also simply referred to as "carrier transport structure"), and a linking structure which branches off from the main chain to link each of the carrier transport structures to the main chain. That is, the conductive polymer according to the present invention includes a linear main chain and a plurality of carrier transport structures each of which is linked to the main chain via the linking structure. As a whole, the conductive polymer has a pendant-like form represented by, for example, the general formulas (3) to (6) (compounds (3) to (6)) described later.

General Formula (1)

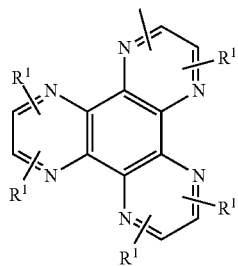

(1)

where each $R^1$ independently represents a hydrogen atom, a methyl group or an ethyl group, and the $R^1$s are the same or different.

General Formula (2)

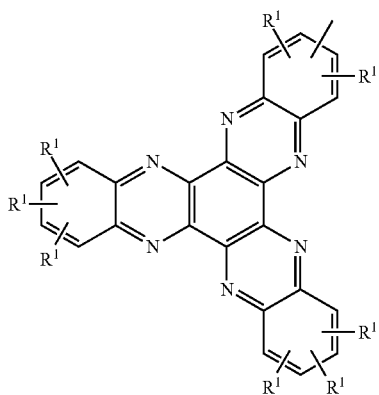

(2)

The conductive polymer has a molecular structure in which the plurality of linking structures are spaced apart at given intervals along a longitudinal direction of the linear main chain. Therefore, adjacent carrier transport structures each linked to the linking structure are spaced by a given interval.

When such a conductive polymer transports holes, volume change or deformation of the carrier transport structures occurs. However, since the adjacent carrier transport structures are spaced by a given interval, it is possible to prevent the carrier transport structures from interfering with each other, thereby preventing or reducing the interaction between the adjacent carrier transport structures.

Therefore, in each of the carrier transport structures, a characteristic electron distribution state (spread of electrons) which contributes to carrier transport can be maintained reliably. This makes it possible for the conductive polymer according to the present invention to exhibit a higher hole transport ability (carrier transport ability). Therefore, the hole transport layer 41 mainly composed of such a conductive polymer can have a higher hole transport ability.

From such a viewpoint, it is preferred that the interval between adjacent carrier transport structures is given as large as possible to such an extent that smooth transfer of holes between them is not inhibited.

The interval between the adjacent carrier transport structures can be controlled by adjusting the interval between adjacent linking structures, that is, by adjusting the number of atoms linearly linked to each other to constitute the main chain existing between the adjacent linking structures.

Specifically, the number of atoms linearly linked to each other to constitute the main chain existing between the adjacent linking structures is preferably 3 to 10, more preferably 5 to 7.

In this regard, it is to be noted that the number of atoms linearly linked to each other to constitute the main chain existing between the adjacent linking structures does not include the number of atoms linked to the linking structure. By setting the number of atoms linearly linked to each other to constitute the main chain existing between the adjacent linking structures to a value within the above range, it is possible to keep an appropriate interval between the adjacent carrier transport structures, thereby enabling to decrease the interaction between the adjacent carrier transport structures in the conductive polymer more reliably and prevent the inhibition of transfer of holes between the carrier transport structures in the conductive polymer more reliably. This further enhances the hole transport ability of the conductive polymer.

If the number of atoms linearly linked to each other to constitute the main chain existing between the adjacent linking structures is less than the above lower limit value, that is, if the interval between the adjacent carrier transport structures is too small, there is a possibility that the interaction between the adjacent carrier transport structures is not sufficiently decreased so that breakage of the hole transport layer 41 is likely to occur (e.g., the hole transport layer 41 is cracked) when the organic EL device 1 is used for a long time or depending on temperature conditions.

On the other hand, if the number of atoms linearly linked to each other to constitute the main chain existing between the adjacent linking structures exceeds the above upper limit value, that is, if the interval between the adjacent carrier transport structures is too large, the carrier transport structures are greatly affected by thermal vibration of the main chain depending on the structure of the main chain or the like. As a result, there is a possibility that it is difficult to keep the interval between the adjacent carrier transport structures constant so that holes are not transferred therebetween with stability.

The number of atoms linearly linked to each other to constitute the main chain existing between the adjacent linking structures may be different from place to place in the conductive polymer, but it is preferred that the number of atoms is substantially the same because it is possible to reduce variations in the interval between the adjacent carrier transport structures. As a result, polarization of electron density in the conductive polymer is reduced, thereby enabling to further enhance the hole transport ability of the conductive polymer.

Further, by allowing the conductive polymer to have a relatively long main chain, it is possible to prevent adjacent conductive polymers from unnecessarily coming close to each other when the hole transport layer 41 is formed. This makes it possible to prevent the occurrence of interaction between the carrier transport structures of the adjacent conductive polymers, thereby enabling to enhance the hole transport ability of the hole transport layer 41. If the chain length of the conductive polymer is unnecessarily long, the solubility of the conductive polymer in a solvent to be used for preparing a hole transport layer material (which will be described later) tends to be lowered, and it is not preferable.

The chain length of the main chain can be defined by, for example, the number of atoms linearly linked to each other in the main chain.

Specifically, the number of atoms linearly linked to each other in the main chain is preferably 200 to 30,000, more preferably 500 to 15,000. By setting the number of atoms linearly linked to each other in the main chain to a value within the above range, it is possible to further enhance the above-described effects.

The structure (composition) of the main chain is not particularly limited as long as it is linear, but it is preferred that the main chain be mainly composed of a saturated hydrocarbon. Since a saturated hydrocarbon, that is, a structure having no unsaturated hydrocarbon (i.e., a structure having no π bond) has high insulation properties, it is possible to prevent appropriately carriers from moving between the adjacent carrier transport structures via the main chain, that is, it is possible to prevent the interaction between the adjacent carrier transport structures via the main chain appropriately.

If the main chain contains a structure having relatively many conjugated π bonds, such as a benzene ring, adjacent carrier transport structures interact with one another via the benzene ring, which cancels the effects obtained by spacing the carrier transport structures apart from each other.

Further, the main chain may contain between the adjacent linking structures a side chain that branches off from the main chain and has a double bond. In this case, even if the interval between the adjacent carrier transport structures is relatively long, holes are transferred between the adjacent carrier transport structures via π electrons of the double bond. As a result, it is possible to prevent or suppress a hole transport ability of the conductive polymer from being decreased due to increased interval between the adjacent carrier transport structures.

Examples of such a side chain include a carboxylic acid chloride group and groups having an ester bond or a urethane bond.

The linking structure is not particularly limited. However, when the number of atoms linearly linked to each other to constitute the main chain existing between the adjacent linking structures is defined as "A" and the number of atoms linearly linked to each other in the linking structure is defined as "B", it is preferred that A and B satisfy the relation $1 \leq A/B \leq 10$, more preferably satisfy the relation $1.5 \leq A/B \leq 5$.

By allowing A and B to satisfy such a relation, that is, by making the length of the linking structure shorter than the interval between the adjacent linking structures, it is possible to prevent reliably the adjacent carrier transport structures from unwillingly coming too close to each other irrespective of the structure of the linking structure. For example, even when the linking structure has flexibility or the interval between the adjacent linking structures is relatively short, it is possible to prevent reliably the adjacent carrier transport structures from unwillingly coming too close to each other. As a result, an appropriate interval is maintained between the adjacent carrier transport structures, thereby enabling to prevent the occurrence of interaction between the adjacent carrier transport structures reliably. Further, transfer of holes between the carrier transport structures can be performed reliably. With these results, the hole transport ability of the conductive polymer is enhanced.

Specifically, in such a conductive polymer, the number of atoms linearly linked to each other in the main chain existing between the adjacent linking structures is preferably 1 to 5, more preferably 2 or 3. By setting the number of atoms linearly linked to each other in the main chain existing between the adjacent linking structures to a value within the above range, it is possible to prevent more reliably the adjacent carrier transport structures from unwillingly coming too close to each other. As a result, the above-described effects are obtained more reliably.

Further, it is preferred that the linking structure contains an amide bond. An amide bond formation reaction is highly reactive, and therefore it is possible to link the carrier transport structure to the main chain reliably when the conductive polymer is synthesized (produced), thereby enabling to obtain a desired conductive polymer with reliability.

Furthermore, in a case where the carrier transport structure represented by the above-mentioned general formula (2) is selected, the linking structure may be linked to any one of 1-, 2-, 3-, and 4-positions on a benzene ring (hexaazatrinaphthylene skeleton) to which the linking structure is linked, but is preferably linked to 2- or 3-position on the benzene ring. By doing so, it is possible to position the carrier transport structure in such a manner that an axis obtained by connecting the benzene ring linked to the linking structure and another benzene ring positioned at the center of the hexaazatrinaphthylene skeleton is closer to perpendicular to the main chain. As a result, variations in interval between the adjacent carrier transport structures from place to place in the conductive polymer is further reduced, thereby reducing the polarization of electron density in the conductive polymer. Therefore, the carrier transport ability of the conductive polymer is further enhanced.

Next, a description will be made with regard to the carrier transport structure of the conductive polymer represented by the above-mentioned general formula (1) or (2).

In the carrier transport structure represented by the general formula (1) or (2), a main skeleton (a hexaazatriphenylene skeleton or hexaazatrinaphthylene skeleton) which is a portion of the carrier transport structure other than its substituents $R^1$ is a region of the carrier transport structure which mainly contributes to carrier (hole) transport. Each of the hexaazatriphenylene skeleton and the hexaazatrinaphthylene skeleton is a structure having a high hole transport ability.

The hexaazatriphenylene skeleton and hexaazatrinaphthylene skeleton also have excellent heat resistance, and therefore the hole transport layer 41 formed using the conductive polymer according to the present invention and the organic EL device 1 provided with such a hole transport layer 41 exhibit excellent heat resistance.

Each substituent $R^1$ is a hydrogen atom, a methyl group or an ethyl group, and any one of them may be selected arbitrarily. However, in a case where the chain length of the main chain is relatively short, it is preferred that either of a methyl group or a ethyl group is selected as the substituent $R^1$. This is advantageous in that in the step <2-1> described later, the solubility of the conductive polymer in a solvent is high when a hole transport layer material is prepared by dissolving the conductive polymer in a solvent, thereby expanding the range of choices of usable solvents.

In view of the above-described structures of the main chain, linking structure, and carrier transport structure, examples of the conductive polymer according to the present invention include compounds represented by the following general formulas (3) to (6) (hereinafter, simply referred to as "compound (3) to compound (6)", respectively).

General Formula (2)

where each $R^1$ independently represents a hydrogen atom, a methyl group or an ethyl group, the $R^1$s are the same or different, each $R^2$ independently represents a hydrogen atom, a methyl group or a phenyl group, the $R^2$s are the same or different, and centrally-located two hydrogen atoms may be replaced by one copper atom, iron atom, zinc atom, indium atom or platinum atom.

General Formula (3)

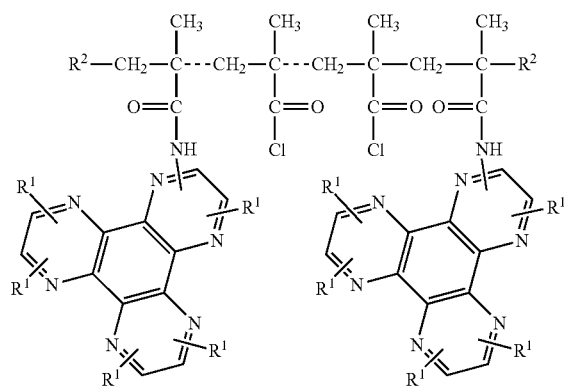

(3)

where each $R^1$ independently represents a hydrogen atom, a methyl group or an ethyl group, the $R^1$s are the same or different, each $R^2$ independently represents a hydrogen atom, a methyl group or a phenyl group, and the $R^2$s are the same or different.

where each $R^1$ independently represents a hydrogen atom, a methyl group or an ethyl group, the $R^1$s are the same or different, each $R^2$ independently represents a hydrogen atom, a methyl group or a phenyl group, and the $R^2$s are the same or different.

General Formula (5)

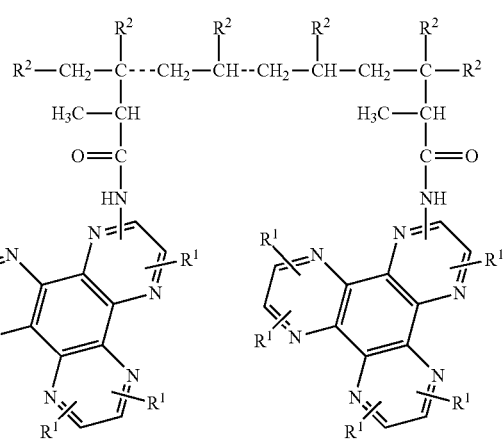

(5)

where each $R^1$ independently represents a hydrogen atom, a methyl group or an ethyl group, the $R^1$s are the same or different, each $R^2$ independently represents a hydrogen atom, a methyl group or a phenyl group, and the $R^2$s are the same or different.

General Formula (4)

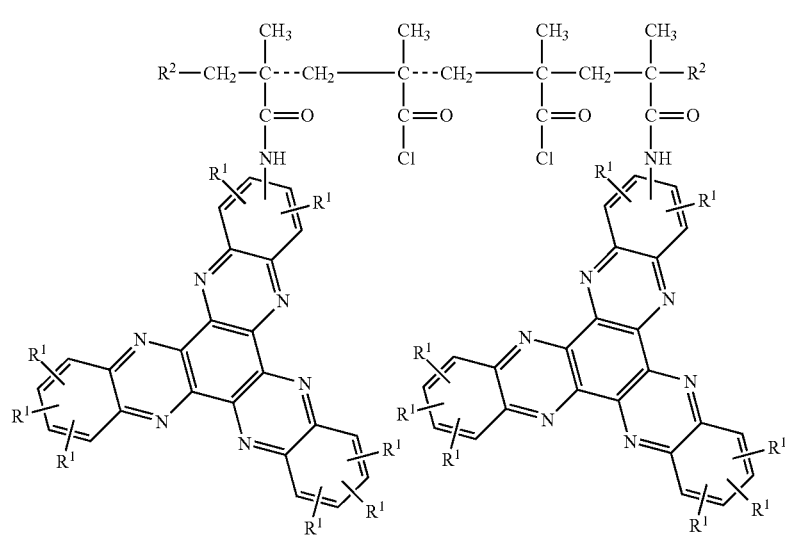

(4)

General Formula (6)

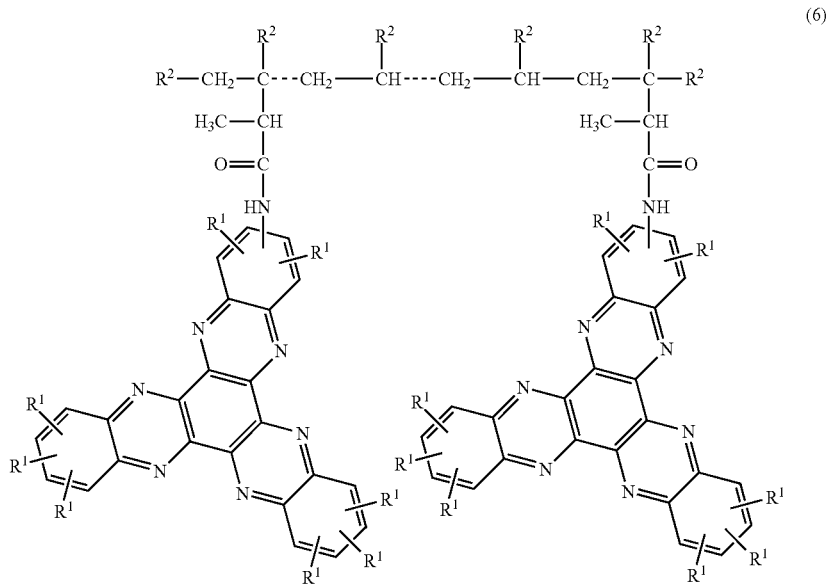

where each $R^1$ independently represents a hydrogen atom, a methyl group or an ethyl group, the $R^1$s are the same or different, each $R^2$ independently represents a hydrogen atom, a methyl group or a phenyl group, and the $R^2$s are the same or different.

The conductive polymer having such a structure described above exhibits a more superior hole transport ability, and the hole transport layer 41 formed using such a conductive polymer has a particularly superior whole transport ability (carrier transport ability).

These compounds (3) to (6) can be obtained by, for example, the following methods, respectively.

<<Compounds (3) and (4)>>

First, it is to be noted that as materials for obtaining the compound (3) or (4), in a case where a compound represented by the following general formula (7) (hereinafter, simply referred to as "compound (7)") is selected, the compound (3) can be obtained, and in a case where a compound represented by the following general formula (8) (hereinafter, simply referred to as "compound (8)") is selected, the compound (4) can be obtained, respectively. Therefore, Hereinbelow, a description will be made with regard to the case where the compound (3) is obtained using the compound (7) as a representative case.

General Formula (7)

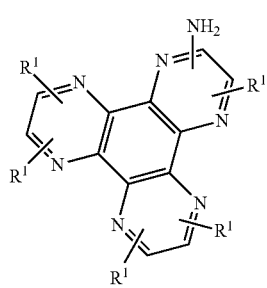

where each $R^1$ independently represents a hydrogen atom, a methyl group or an ethyl group, and the $R^1$s are the same or different.

General Formula (8)

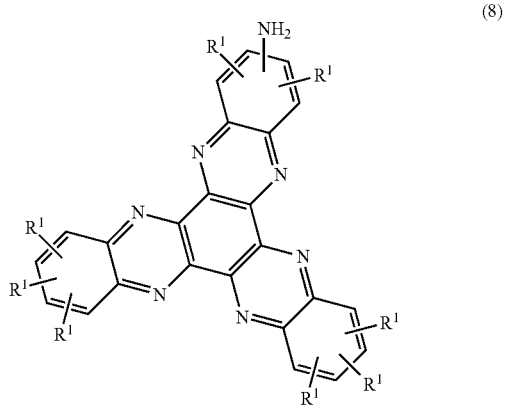

where each $R^1$ independently represents a hydrogen atom, a methyl group or an ethyl group, and the $R^1$s are the same or different.

<1A> First, the Compound (7) and a Base are Dissolved in a Solvent to Prepare a First Reaction Solution.

Examples of such a solvent that can be used in preparing the first reaction solution include halogen compound-based solvents such as dichloromethane (methylene chloride), trichloromethane, carbon tetrachloride, 1,1-dichloroethane, 1,2-dichloroethane, 1,1,1-trichloroethane, and pentachloroethane, aromatic hydrocarbon-based solvents such as toluene, xylene, and benzene, and ether-based solvents such as diethyl ether, diisopropyl ether, 1,2-dimethoxyethane (DME), 1,4-dioxane, tetrahydrofuran, (THF), tetrahydropyran (THP), anisole, diethylene glycol dimethyl ether (diglyme), and diethylene glycol ethyl ether (Carbitol). These solvents can be used singly or in combination of two or more of them.

Examples of such a base include triethylamine, tributylamine, dimethylaniline, and formyldimethylamine. These bases can be used singly or in combination of two or more of them.

It is preferred that the mixing mole ratio between the compound (7) and the base be substantially 1:1 (especially, 1:1).

<2A> Next, Polyacrylic Acid Chloride is Dissolved in a Solvent to Prepare a Second Reaction Solution.

Examples of such a solvent that can be used in preparing the second reaction solution include ester-based solvents such as ethyl acetate, methyl acetate, ethyl formate, methyl salicylate, and ethyl propionate, nitrile-based solvents such as acetonitrile, propionitrile, and acrylonitrile, and alcohol-based solvents such as methanol, ethanol, isopropanol, ethylene glycol, diethylene glycol, and glycerol. These solvents can be used singly or in combination of two or more of them.

<3A> Next, the Second Reaction Solution is Dropped into the First Reaction Solution which is being Stirred. By doing so, Polyacrylic Acid Chloride Reacts with the Plurality of Compounds (7) to Form the Compound (3).

The time for reacting polyacrylic acid chloride with the plurality of compounds (7) is preferably about 2 to 10 hours, more preferably about 4 to 6 hours.

At this time, the temperature of the reaction solution is preferably about 0 to 90° C., more preferably about 25 to 70° C.

It is to be noted that by appropriately setting reaction conditions such as the concentration of the compound (7), the concentration of polyacrylic acid chloride, the reaction time, and the temperature of the reaction solution, it is possible to control the amount of the compound (7) to be linked to polyacrylic acid chloride. In order to appropriately set the reaction conditions for the compound (3) to be obtained, it is preferred that the amount of the compound (7) to be reacted with polyacrylic acid chloride be determined by experiment in advance.

Further, after the completion of the reaction between polyacrylic acid chloride and the compound (7), an alcohol such as methanol or ethanol may be added to the reaction solution, if necessary. By adding such an alcohol to the reaction solution, a carboxylic acid chloride group remaining in the main chain of the compound (3) can be changed to an ester group such as a methyl ester group or an ethyl ester group.

<4A> Next, a By-Product Precipitated in the Reaction Solution is Separated by Filtration to Obtain a Filtrate, and then the Compound (3) is Precipitated Out of the Filtrate. The Compound (3) is Separated by Filtration, and is then Washed and Dried to Obtain the Compound (3) in a Solid Form.

<<Compound (5) and (6)>>

In this regard, it is to be noted that as materials for obtaining the compound (5) or (6), in a case where a compound represented by the general formula (7) is selected, the compound (5) can be obtained, and in a case where a compound represented by the general formula (8) is selected, the compound (6) can be obtained, respectively. Therefore, hereinbelow, a description will be made with regard to the case where the compound (5) is obtained using the compound (7) as a representative case.

<1B> First, the Compound (7) is Dissolved in a Solvent or Dispersed in a Dispersion Medium, and then Acrylic Acid Chloride is Dropped into the Solution or Dispersion which is being Stirred.

By doing so, the compound (7) reacts with acrylic acid chloride to form a compound represented by the following general formula (9) (hereinafter, simply referred to as "compound (9)"). Thereafter, the solvent or dispersion medium is removed (that is, elimination of solvent or elimination of dispersion medium is carried out) to obtain the compound (9) in a solid form.

General Formula (9)

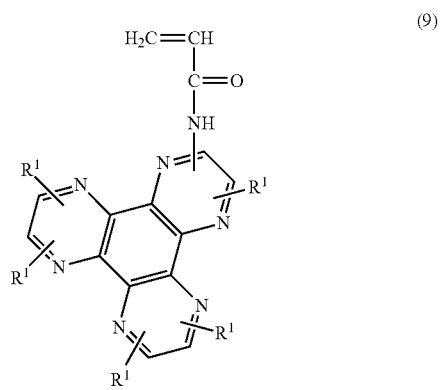

(9)

where each $R^1$ independently represents a hydrogen atom, a methyl group or an ethyl group, and the $R^1$s are the same or different.

The solvent or dispersion medium in which the compound (4) is to be dissolved or dispersed is not particularly limited. Examples of such a solvent or dispersion medium include: inorganic solvents such as nitric acid, sulfuric acid, ammonia, hydrogen peroxide, water, carbon disulfide, carbon tetrachloride, and ethylene carbonate; various organic solvents such as ketone-based solvents (e.g., methyl ethyl ketone (MEK), acetone, diethyl ketone, methyl isobutyl ketone (MIBK), methyl isopropyl ketone (MIPK), cyclohexanone), alcohol-based solvents (e.g., methanol, ethanol, isopropanol, ethylene glycol, diethylene glycol (DEG), glycerol), ether-based solvents (e.g., diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), diethylene glycol ethyl ether (Carbitol)), cellosolve-based solvents (e.g., methyl cellosolve, ethyl cellosolve, phenyl cellosolve), aliphatic hydrocarbon-based solvents (e.g., hexane, pentane, heptane, cyclohexane), aromatic hydrocarbon-based solvents (e.g., toluene, xylene, benzene), aromatic heterocyclic compound-based solvents (e.g., pyridine, pyrazine, furan, pyrrole, thiophene, methylpyrrolidone), amide-based solvents (e.g., N,N-dimethylformamide (DMF), N,N-dimethylacetamide (DMA)), halogen compound-based solvents (e.g., dichloromethane, chloroform, 1,2-dichloroethane), ester-based solvents (e.g., ethyl acetate, methyl acetate, ethyl formate), sulfur compound-based solvents (e.g., dimethyl sulfoxide (DMSO), sulfolane), nitrile-based solvents (e.g., acetonitrile, propionitrile, acrylonitrile), and organic acid-based solvents (e.g., formic acid, acetic acid, trichloroacetic acid, trifluoroacetic acid); and mixed solvents containing two or more of them.

The time for reacting the compound (4) with acrylic acid chloride is preferably about 30 minutes to 6 hours, more preferably about 1 to 3 hours.

At this time, the temperature of the reaction solution is preferably about 0 to 90° C., more preferably about 25 to 50° C.

<2B> Next, a Radical Generating Agent and a Polyolefin Compound are Dissolved in a Solvent to Prepare a Third Reaction Solution.

Examples of such a radical generating agent include benzoyl peroxide, azobisisobutyronitrile, and dialkyl peroxide.

Among them, benzoyl peroxide is particularly preferred. By using such a radical generating agent, it is possible to generate a radical at a relatively low heating temperature in the next step <3B> reliably.

The polyolefin compound is not particularly limited as long as it allows the compound (3) to be generated in the next step <3B>. Examples of such a polyolefin compound include polyester, polypropylene, and polystyrene.

Examples of such a solvent that can be used in preparing the third reaction solution include, but are not limited thereto, the same solvents as those used to prepare the first reaction solution in the step <1A>.

<3B> Next, the Third Reaction Solution is Heated while being Stirred.

By doing so, radicals generated from the radical generating agent react with the polyolefin compound to form a compound represented by the following general formula (10) (hereinafter, simply referred to as "compound (10)"), in which a plurality of tertiary radicals are generated in the polyolefin compound.

General Formula (10)

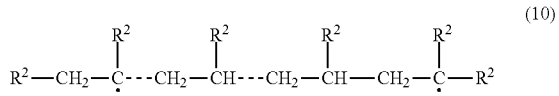

(10)

where each $R^2$ independently represents a hydrogen atom, a methyl group or a phenyl group, and the $R^2$s are the same or different.

The time for heating the third reaction solution is preferably about 1 to 7 hours, more preferably about 2 to 3 hours.

The temperature at which the third reaction solution is heated is preferably about 50 to 150° C., more preferably about 70 to 120° C.

It is to be noted that by appropriately setting reaction conditions such as the concentration of the radical generating agent, the concentration of the polyolefin compound, the heating time, and the heating temperature, it is possible to control the amount of radicals to be generated in the polyolefin compound. In order to appropriately set the reaction conditions for a compound (5) to be obtained, it is preferred that the amount of radicals to be generated in the polyolefin compound is determined by experiment in advance. By doing so, it is possible to control the amount of the compound (9) to be linked to the polyolefin compound in the next step <4B> described below.

<4B> Next, the Solid Compound (9) Obtained in the Step <1B> is Added to the Third Reaction-Solution Containing the Compound (10) with being Stirred.

By doing so, the compound (9) reacts with the compound (10) to form the compound (5).

The time for reacting the compound (9) with the compound (10) is preferably about 1 to 10 hours, more preferably about 2 to 6 hours.

At this time, the temperature of the third reaction solution is preferably about 50 to 150° C., more preferably about 70 to 120° C.

<5B> Next, the Compound (5) is Precipitated Out of the Reaction Solution. Thereafter, the Compound (5) is Separated by Filtration, and is then Washed and Dried to Obtain the Compound (5) in a Solid Form.

Through the above-described steps, the compounds (3) to (6) are produced.

The hole transport layer 41 is formed using the conductive polymer according to the present invention (that is, a polymer) as its main material, and therefore the hole transport layer 41 has excellent resistance to solvents. Therefore, it is possible to prevent reliably the conductive polymer from being swelled or dissolved by a solvent or a dispersion medium contained in a material for use in forming the light emitting layer 42 when the light emitting layer 42 is formed on the hole transport layer 41.

In addition, it is also possible to prevent reliably the conductive polymer and the constituent material of the light emitting layer 42 from being mixed together with the lapse of time in the vicinity of the interface between the hole transport layer 41 and the light emitting layer 42, thereby preventing the properties of the organic EL device 1 from being deteriorated with the lapse of time.

The volume resistivity of the conductive polymer is preferably 10 Ω·cm or more, more preferably $10^2$ Ω·cm or more. This enables an organic EL device 1 having higher light emitting efficiency to be obtained.

The thickness of the hole transport layer 41 is not particularly limited, but is preferably about 1 to 100 nm, more preferably about 10 to 50 nm. If the thickness of the hole transport layer 41 is too thin, there is a possibility that a pin hole is produced. On the other hand, if the thickness of the hole transport layer 41 is too thick, there is a possibility that the transmittance of the hole transport layer 41 is lowered so that the chromaticity (hue) of luminescent color of the organic EL device 1 is changed.

In this regard, it is to be noted that both the hexaazatrinaphthylene skeleton and the hexaazatrinaphthylene skeleton provide a blue color. Therefore, a hole transport layer 41 formed using a conductive poly according to the present invention which has these skeletons also provides a blue color. As a result, in an organic EL device to be formed using the conductive polymer, components other than a blue color are absorbed from light emitted from the light emitting layer 42 when the light passes through the hole transport layer 41.

Therefore, by appropriately setting the thickness of the hole transport layer 41, it is possible to absorb the quantity of light which has a color other than a blue color and is secondarily generated when the light passes through the hole transport layer 41, thereby enabling to improve the purity of luminescent color. In this regard, it is to be noted that in a case where the thickness of the hole transport layer 41 is relatively thick, the contrast of light emission between different organic EL devices 1 which emit light of different colors can be made clearer. On the other hand, in a case where the thickness of the hole transport layer 41 is relatively thin, the quantity of light absorbed by the hole transport layer 41 is made to be small, and therefore there is an advantage in that an apparent external light emission efficiency is improved.

The electron transport layer 43 has the function of transporting electrons, which are injected from the cathode 5, to the light emitting layer 42.

Examples of a constituent material of the electron transport layer 43 (hereinafter, referred to as "electron transport material") include: benzene-based compounds (starburst-based compounds) such as 1,3,5-tris[(3-phenyl-6-tri-fluoromethyl) quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as, florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand.

Further, the above-mentioned compounds that can be used as an electron transport material may be used singly or in combination of two or more of them.

The thickness of the electron transport layer 43 is not limited to any specific value, but is preferably in the range of about 1 to 100 nm, more preferably in the range of about 20 to 50 nm. If the thickness of the electron transport layer 43 is too thin, there is a case that a pin hole is produced, causing a short-circuit. On the other hand, if the electron transport layer 43 is too thick, there is a case that the value of resistance becomes high.

When a current flows between the anode 3 and the cathode 5 (that is, a voltage is applied across the anode 3 and the cathode 5), holes are moved in the hole transport layer 41 and electrons are moved in the electron transport layer 43. The holes and electrons are not combined immediately in the light emitting layer 42, and a pair of an electron and a hole in a special excited state, that is, an exciton is formed. When an exciton decays, an electron and a hole are combined to release energy (in the form of fluorescence or phosphorescence) or emit light.

Any material can be used as a constituent material of the light emitting layer 42 (hereinafter, referred to as "light emitting material") so long as it can provide a field where holes can be injected from the anode 3 and electrons can be injected from the cathode 5 during the application of a voltage to allow the holes and the electrons to be recombined.

Such light emitting materials include various low-molecular light emitting materials and various high-molecular light emitting materials (which will be mentioned below). These materials can be used singly or in combination of two or more of them.

In this regard, it is to be noted that the use of a low-molecular light emitting material makes it possible to obtain a dense light emitting layer 42, thereby improving the light emitting efficiency of the light emitting layer 42. Further, since a high-molecular light emitting material is relatively easily dissolved in a solvent, it is possible to form the light emitting layer 42 easily by means of various application methods such as an ink-jet printing method and the like. Furthermore, if a low-molecular light emitting material and a high-molecular light emitting material are used together, it is possible to obtain the synergistic effect resulted from the effect of the low-molecular light emitting material and the effect of the high-molecular light emitting material. That is, it is possible to obtain an effect that a dense light emitting layer 42 having an excellent light emitting efficiency can be easily formed by means of various application methods such as an ink-jet printing method and the like.

Examples of such a low-molecular light emitting material include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene, and N,N'-bis(2,5-di-t-butylphenyl)-3,4,9,10-perylene-di-carboxyimide (BPPC); coronene-based compounds such as coronene; anthracene-based compounds such as anthracene, and bis-styrylanthracene; pyrene-based compounds such as pyrene; pyran-based compounds such as 4-(di-cyanomethylene)-2-methyl-6-(para-dimethylaminostyryl)-4 H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene), and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine, and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$), and copper phthalocyanine; florene-based compounds such as florene; and various metallic complexes such as 8-hydroxyquinoline, aluminum ($Alq_3$), tris(4-methyl-8-quinolinolate) aluminum(III) ($Almq_3$), 8-hydroxyquinoline zinc ($Znq_2$), (1,10-phenanthroline)-tris-(4,4,4-trifluoro-1-(2-thienyl)-butane-1,3-dionate) europium(III) ($Eu(TTA)_3$ (phen)), fac-tris(2-phenylpyridine) iridium ($Ir(ppy)_3$), and 2,3,7,8,12,13,17,18-octaethyl-21H, 23H-porphin platinum (II).

Examples of such a high-molecular light emitting material include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly (para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT), and poly(oxypropylene) triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6 am4), and poly(9,9-dioctyl-2,7-divinylenefluorenyl)-alt-co(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMS), poly(naphthylphenylsilane) (PNPS), and poly(biphenylylphenylsilane) (PBPS).

The thickness of the light emitting layer 42 is not limited to any specific value, but is preferably in the range of about 10 to 150 nm, more preferably in the range of about 50 to 100 nm. By setting the thickness of the light emitting layer to a value within the above range, recombination of holes and electrons occurs efficiently, thereby enabling the light emitting efficiency of the light emitting layer 42 to be further improved.

Although, in the present embodiment, each of the light emitting layer 42, the hole transport layer 41 and the electron transport layer 43 is separately provided, they may be formed into a hole-transportable light emitting layer which combines the hole transport layer 41 with the light emitting layer 42 or an electron-transportable light emitting layer which combines the electron transport layer 43 with the light emitting layer 42. In this case, an area in the vicinity of the interface between the hole-transportable light emitting layer and the electron transport layer 43 or an area in the vicinity of the interface between the electron-transportable light emitting layer and the hole transport layer 41 functions as the light emitting layer 42.

Further, in a case where the hole-transportable light emitting layer is used, holes injected from an anode into the hole-transportable light emitting layer are trapped by the electron transport layer, and in a case where the electron-transportable light emitting layer is used, electrons injected from a cathode into the electron-transportable light emitting layer are trapped in, the electron-transportable light emitting layer. In both cases, there is an advantage that the recombination efficiency of holes and electrons can be improved.

Furthermore, between the adjacent layers in the layers 3, 4 and 5, any additional layer may be provided according to its purpose. For example, a hole injecting layer may be provided between the hole transport layer 41 and the anode 3, or an electron injecting layer may be provided between the electron transport layer 43 and the cathode 5. In such a case where the organic EL device 1 is provided with the hole injecting layer, the conductive polymer according to the present invention may be used for the hole injecting layer.

For example, in a case where the anode 3 is composed of an oxide such as ITO, $SnO_2$, Sb-containing $SnO_2$, or Al-containing Zno, use of the conductive polymer according to the present invention to the hole injecting layer is particularly effective. Further, since the carrier transport structure represented by the above-mentioned general formula (1) or the above-mentioned general formula (2) has a high affinity for water, the hole injecting layer is brought into intimate contact with the anode 3 composed of an oxide. This makes it possible to transfer holes from the anode 3 to the hole transport layer 41 via the hole injecting layer reliably.

Further, in a case where, the organic EL device 1 is provided with the electron injecting layer as described above, alkali halides such as LiF can be used for the electron injecting layer besides the above-mentioned electron transport materials.

The protection layer 6 is provided so as to cover the layers 3, 4 and 5 constituting the organic EL device 1. This protection layer 6 has the function of hermetically sealing the layers 3, 4 and 5 constituting the organic EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protection layer 6 include Al, Au, Cr, Nb, Ta, Ti, alloys containing them, silicon oxide, various resin materials, and the like. In this regard, it is to be noted that in a case where a conductive material is used as a constituent material of the protection layer 6, it is preferred that an insulating film is provided between the protection layer 6 and each of the layers 3, 4 and 5 to prevent a short circuit therebetween, if necessary.

This organic EL device 1 can be used for, for example, displays, but it can also be used for various optical purposes such as a light source and the like.

In a case where the organic EL device 1 is applied to a display, the drive system thereof is not particularly limited, and either of an active matrix system or a passive matrix system may be employed.

The organic EL device 1 as described above can be manufactured in the following manner, for example.

<1C> Step of Forming Anode

First, a substrate 2 is prepared, and then an anode 3 is formed on the substrate 2.

The anode 3 can be formed by, for example, chemical vapor deposition (CVD) such as plasma CVD, thermal CVD, or laser CVD, dry plating such as vacuum deposition, sputtering, or ion plating, wet plating such as electrolytic plating, immersion plating, or electroless plating, sputtering, a sol-gel method, a MOD method, bonding of a metallic foil, or the like.

<2C> Step of Forming Hole Transport Layer

Next, the hole transport layer 41 is formed on the anode 3.

The hole transport layer 41 can be formed by, for example, an application method, a vacuum evaporation method, an ion beam evaporation, or an electrostatic application method. Among these methods, an application method is particularly preferred. According to the application method, it is possible to apply the conductive polymer according to the present invention onto the anode 3 in such a manner that the carrier transport structures constituting the conductive polymer are not inclined to the thickness direction of the anode 3 but are substantially parallel to the anode 3. Therefore, in a resulting hole transport layer 41, the carrier transport structures of the conductive polymer are stacked along the thickness direction of the hole transport layer 41, thereby enabling holes to be transferred between the stacked carrier transport structures, that is, along the thickness direction of the hole, transport layer 41 more reliably. This further enhances the hole transport ability of the hole transport layer 41.

It is to be noted that the main skeleton of the carrier transport structure, that is, a hexaazatrinaphenylene skeleton and a hexaazatrinaphthylene skeleton have solubility only to limited solvents. However, by allowing the conductive polymer according to the present invention to have a structure in which each carrier transport structure (that is, the main skeleton) is linked to the main chain via the linking structure, it is possible to improve the solubility of the conductive polymer to a solvent, so that the range of choices for solvents can be expanded. Therefore, by adopting the structure like the conductive polymer according to the present invention, it is possible to obtain the effect using the application method reliably.

Hereinbelow, the step of forming the hole transport layer 41 using an application method will be described by way of example.

<2C-1> First, the conductive polymer according to the present invention is dissolved in a solvent to obtain a hole transport layer material, and then the hole transport layer material is applied (supplied) onto the anode 3.

In the application of the hole transport layer material, various application methods such as a spin coating method, a casting method, a microgravure coating method, a gravure coating method, a bar coating method, a roll coating method, a wire bar coating method, a dip coating method, a spray coating method, a screen printing method, a flexographic printing method, an offset printing method, and an ink jet printing method can be employed. According to such an application method, it is possible to apply the hole transport layer material onto the anode 3 relatively easily.

Examples of a solvent for dissolving the hole transport layer material include, but are not limited thereto, the same solvents as those used for preparing the first reaction solution in the step <1A>.

<2C-2> Next, the hole transport layer material applied onto the anode 3 is dried.

As a result, the organic solvent is removed from the hole transport layer material so that the hole transport layer 41 containing the conductive polymer as its main material is formed on the anode 3.

A method for drying the hole transport layer material is not particularly limited. For example, the hole transport layer material is naturally dried or the organic solvent is actively removed by heat drying or vacuum drying.

By forming the hole transport layer 41 using the conductive polymer according to the present invention as its main material, it is possible to prevent the hole transport layer 41 from being swelled or dissolved by a solvent or a dispersion medium contained in a light emitting layer material when the light emitting layer material is supplied onto the hole transport layer 41 in the next step <3C>>. As a result, it is possible to prevent reliably such a situation that the hole transport layer 41 and the light emitting layer 42 are mutually dissolved.

<3C> Step of Forming Light Emitting Layer

Next, the light emitting layer 42 is formed on the hole transport layer 41.

The light emitting layer 42 can be formed by, for example, applying a light emitting layer material (that is, a material for forming a light emitting layer) obtained by dissolving or dispersing the light emitting material as mentioned above in a solvent or a dispersion medium onto the hole transport layer 41.

Examples of such a solvent or such a dispersion medium for dissolving or dispersing a light emitting material include the same solvents or dispersion media as described above with reference to the step <1B>.

As a method for applying the light emitting layer material onto the hole transport layer 41, the same application methods as those used for forming the hole transport layer 41 can be employed.

<4C> Step of Forming Electron Transport Layer

Next, the electron transport layer 43 is formed on the light emitting layer 42.

The electron transport layer 43 can be formed in the same manner as the light emitting layer 42. Namely, the electron transport layer 43 can be formed using the electron transport material as mentioned above by the method described above with reference to the light emitting layer 42.

<5C> Step of Forming Cathode

Next, the cathode 5 is formed on the electron transport layer 43.

The cathode 5 can be formed by, for example, vacuum deposition, sputtering, bonding of a metallic foil, or the like.

<6C> Step of Forming Protection Layer

Next, the protection layer 6 is formed so as to cover the anode 3, the organic EL layer 4 and the cathode 5.

The protection layer 6 can be formed (provided) by, for example, bonding a box-like protection cover constituted of the material as mentioned above by the use of various curable resins (adhesives).

As for the curable resins, all of thermosetting resins, photocurable resins, reactive curable resins, and anaerobic curable resins can be used.

The organic EL device 1 is manufactured through these steps as described above.

<Electronic Equipment>

The organic EL device 1 according to the present invention (that is, the electronic device according to the present invention) can be used for various electronic equipment.

Figure 2:
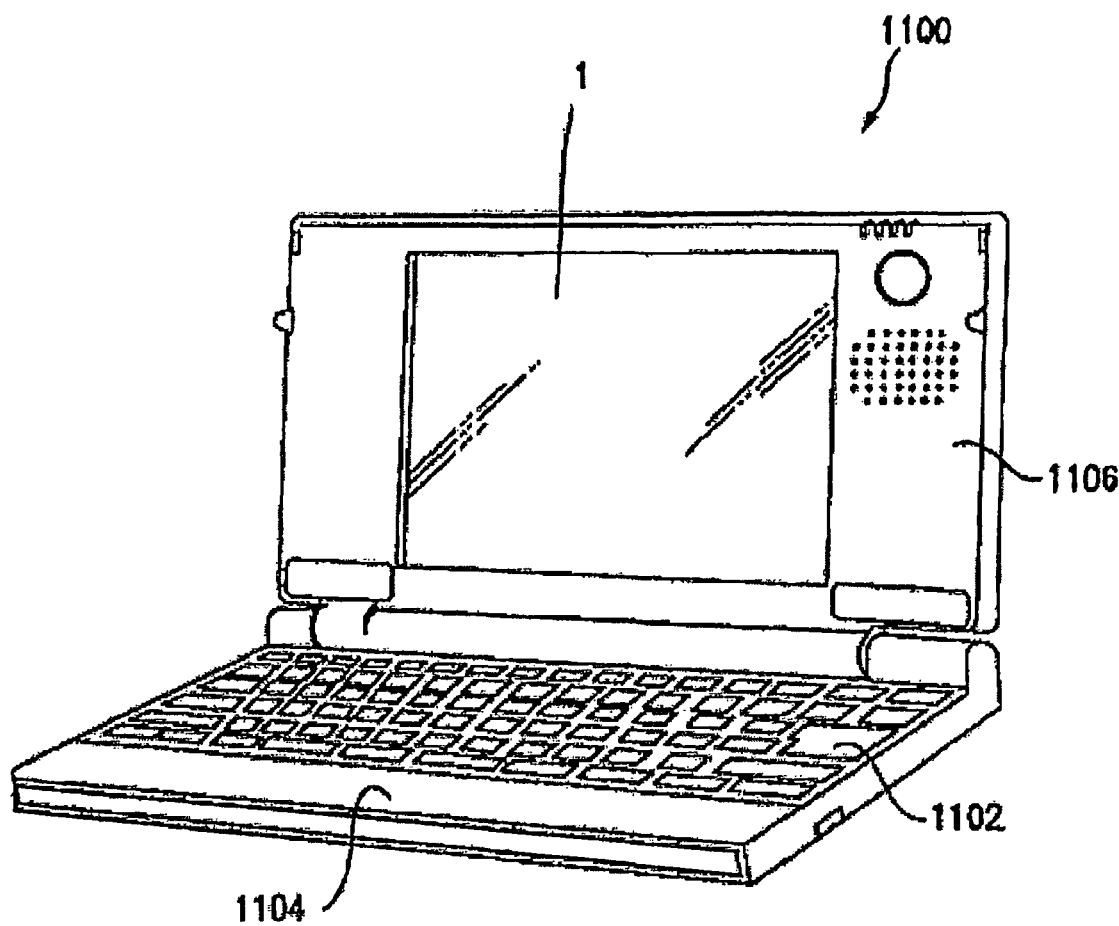
FIG. 2 is a perspective view which shows the structure of a personal mobile computer (or a personal notebook computer) to which the electronic equipment according to the present invention is applied.

FIG. 2 is a perspective view which shows a structure of a personal mobile computer (or a personal laptop computer) to which the electronic equipment according to the present invention is applied.

In FIG. 2, a personal computer 1100 is comprised of a main body 1104 provided with a keyboard 1102 and a display unit 1106 provided with a display. The display unit 1106 is rotatably supported by the main body 1104 via a hinge structure.

In the personal computer 1100, the display unit 1106 includes the above-described organic EL device 1 (which is an electronic device).

Figure 3:
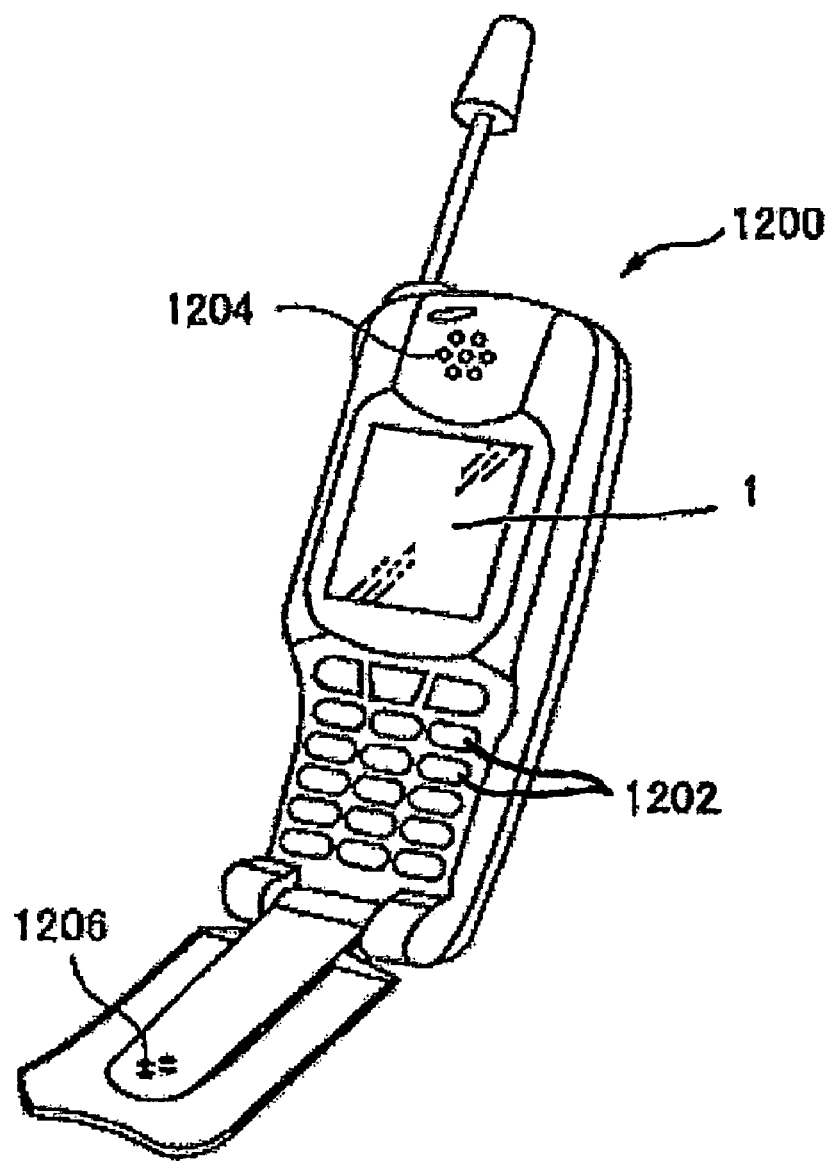
FIG. 3 is a perspective view which shows the structure of a mobile phone (including the personal handyphone system (PHS)) to which the electronic equipment according to the present invention is applied.

FIG. 3 is a perspective view which shows a structure of a mobile phone (including the personal handyphone system (PHS)) to which the electronic equipment according to the present invention is applied.

In FIG. 3, a mobile phone 1200 includes a plurality of operation buttons 1202, an earpiece 1204, a mouthpiece 1206, and a display.

In this mobile phone 1200, for example, the display includes the above-described organic EL device 1 (which is an electronic device).

Figure 4:
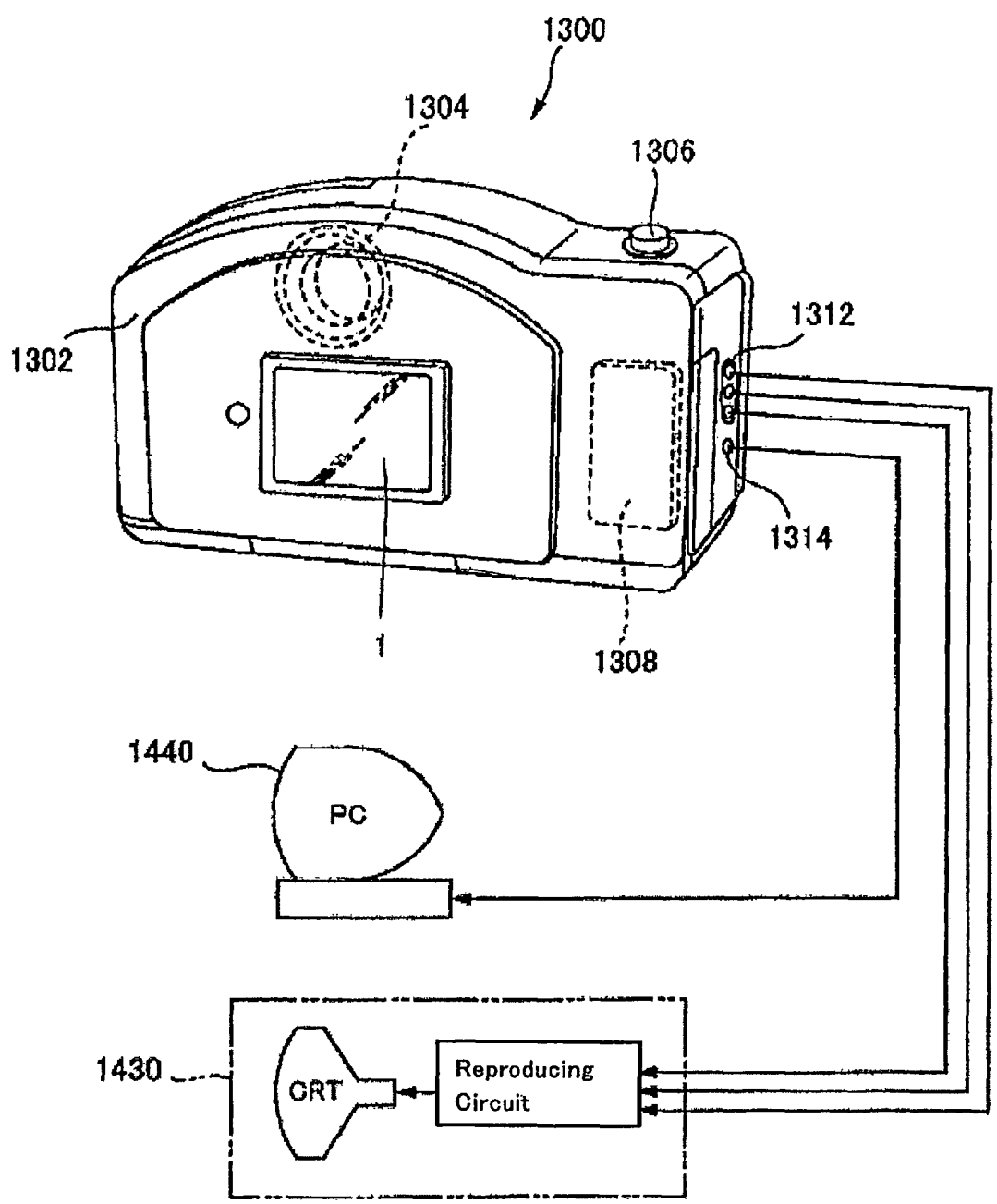
FIG. 4 is a perspective view which shows the structure of a digital still camera to which the electronic equipment, according to the present invention is applied.

FIG. 4 is a perspective view which shows a structure of a digital still camera to which the electronic equipment according to the present invention is applied. In this drawing, interfacing, to external devices is simply illustrated.

In a conventional camera, a silver salt film is exposed to the optical image of an object. On the other hand, in a digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on an image pickup signal generated by the CCD. That is, the display functions as a finder which displays the object as an electronic image.

In this digital still camera 1300, for example, the display includes the above-described organic EL device 1 (which is an electronic device).

In the inside of the case, there is provided a circuit board 1308. The circuit board 1308 has a memory capable of storing an image pickup signal.

In the front surface of the case 1302 (in FIG. 4, the front surface of the case 1302 is on the back side), there is provided a light receiving unit 1304 including an optical lens (an image pickup optical system), the CCD, etc.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 4, if necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operation.

The electronic equipment according to the present invention can be applied not only to the personal computer (which is a personal mobile computer) shown in FIG. 2, the mobile phone shown in FIG. 3, and the digital still camera shown in FIG. 4 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph, monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

Although the conductive polymer, the conductive layer, the electronic device, and the electronic equipment according to the present invention have been described with reference to the embodiments shown in the drawings, the present invention is not limited thereto.

For example, in a case where the electronic device according to the present invention has a hole transport layer as a conductive layer, such an electronic device can be used for a solar cell that is an example of light receiving devices (or photoelectric transducers) as well as the organic EL device as described above that is an example of display devices (or light emitting devices).

Further, the conductive layer according to the present invention can be used as, for example, wiring, electrodes, or organic semiconductor layers as well as the hole transport layer as described above. In this case, a resultant electronic device according to the present invention can be used for, for example, switching elements (thin film transistors), wiring substrates, and semiconductor devices.

EXAMPLES

Next, actual examples of the present invention will be described.

1. Synthesis of Conductive Polymer

First, the following compounds (A) to (N) were prepared.
<Compound (A)>

First, 0.1 mol of the compound (7) (which is represented by the general formula (7) wherein each $R^1$ is a hydrogen atom, and the amino group is linked to the 2-position of the hexaazatrinaphenylene skeleton) and 0.01 mol of triethylamine were dissolved in 100 mL of a tetrahydrofuran solution.

Next, 0.5 g of polyacrylic acid chloride (the number of atoms linearly linked to each other: about 13,000) was dissolved in 20 mL of an ethyl acetate solution.

Next, the ethyl acetate solution of polyacrylic acid chloride was dropped into the tetrahydrofuran solution of the compound (7) which was being stirred at room temperature (drop time: about 30 minutes). After the completion of dropping, the mixture was stirred at room temperature for about 5 hours, and was then heated to 70° C. and stirred for 1 hour.

After the completion of stirring, a white precipitate of triethylamine hydrochloride was separated by filtration to obtain a filtrate.

Next, the filtrate was poured into petroleum ether, and the thus obtained precipitate was separated by filtration. The precipitate separated by filtration was again dissolved in tetrahydrofuran, the tetrahydrofuran solution of the precipitate was poured into petroleum ether to form a precipitate, and the precipitate was separated by filtration. This operation was carried out three times to purify the precipitate.

Next, the precipitate separated by filtration was dried to obtain a compound (A).

It was found that the compound (A) had the structure of the compound (3) by using a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

It is to be noted that the number of atoms linearly linked to each other to constitute the main chain existing between the adjacent linking structures can be represented as the number of carbon atoms linearly linked to each other (hereinafter, simply referred togas the "number of carbons"). In the case of the compound (A), it was found that the number of carbons was 5 or 6 for the most part thereof.

<Compound (B)>

A compound (B) was prepared in the same manner as in the case of the compound (A) except that the time for stirring the mixture obtained by dropping the ethyl acetate solution of polyacrylic acid chloride into the tetrahydrofuran solution of the compound (3) was changed to about 3 hours and the time for stirring the mixture heated to 70° C. was changed to 30 minutes. In the case of the compound (B), the number of carbons was 8 to 10 for the most part thereof.

<Compound (C)>

A compound (C) was prepared in the same manner as in the case of the compound (A) except that the time for stirring the mixture obtained by dropping the ethyl acetate solution of polyacrylic acid chloride into the tetrahydrofuran solution of the compound (7) was changed to about 7 hours. In the case of the compound (C), the number of carbons was 3 or 4 for the most part thereof.

<Compound (D)>

A compound (D) was prepared in the same manner as in the case of the compound (A) except that the time for stirring the mixture obtained by dropping the ethyl acetate solution of polyacrylic acid chloride into the tetrahydrofuran solution of the compound (7) was changed to about 1 hour and the time for stirring the mixture heated to 70° C. was changed to 10 minutes. In the case of the compound (D), the number of carbons was 11 to 13 for the most part thereof.

<Compound (E)>

A compound (E) was prepared in the same manner as in the case of the compound (A) except that the time for stirring the mixture obtained by dropping the ethyl acetate solution of polyacrylic acid chloride into the tetrahydrofuran solution of the compound (7) was changed to about 7 hours. In the case of the compound (E), the number of carbons was 1 or 2 for the most part thereof.

<Compound (F)>

A compound (F) was prepared in the same manner as in the case of the compound (A) except that the compound (7) was changed to one represented by the general formula (7) wherein four $R^1$s are ethyl groups linked to 6-, 7-, 10-, and 11-positions of the hexaazatrinaphenylene skeleton, respectively, and the other $R^1$ is a hydrogen atom. In the case of the compound (F), the number of carbons was 5 or 6 for the most part thereof.

<Compound (G)>

First, 0.1 mol of acrylic acid chloride was dropped into 100 mL of a chloroform solution, in which 0.1 mol of the compound (7) (which is represented by the general formula (7) wherein each $R^1$ is a hydrogen atom and an amino group is linked to the 2-position of hexaazatrinaphenylene skeleton) was dispersed, with stirring at room temperature (drop time: about 20 minutes). After the completion of dropping, the thus obtained mixture was stirred at room temperature for about 1 hour, and was then heated to 50° C. and stirred for 3 hours.

After the completion of stirring, chloroform was removed from the mixture to obtain a compound (9) in a solid form.

Next, benzoyl peroxide was prepared as a radical generating agent, and powdered polyethylene was prepared as a polyolefin compound. Then, 0.0001 mol of the powdered polyethylene (the number of atoms linearly linked to each other: about 1,000) was added to 100 mL of xylene at room temperature, and they were heated to 120° C. with stirring to disperse or dissolve the powdered polyethylene in xylene. Thereafter, the solution was cooled to room temperature. 0.03 mol of benzoyl peroxide was added to the solution with stirring, and then the solution was gradually heated to 120° C. to terminate reaction. As a result, a compound (10) (in which each $R^2$ is a hydrogen atom or a phenyl group) containing radicals in polyethylene was produced.

Next, the previously prepared compound (9) was added to the solution in which the compound (10) was produced, and they were stirred at 120° C. for 5 hours.

Next, the thus obtained solution was poured into petroleum ether to form a precipitate, and the precipitate was separated by filtration. The precipitate separated by filtration was dissolved in tetrahydrofuran, the tetrahydrofuran solution of the precipitate was poured into petroleum ether, and an obtained precipitate was separated by filtration. This operation was carried out three times to purify the precipitate.

Next, the precipitate separated by filtration was dried to obtain a compound (G).

It was found that the compound (G) had the structure of the compound (5) by using a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.

Further, it was found that the number of carbons was 6 or 7 for the most part thereof.

<Compound (H)>

A compound (H) was prepared in the same manner as in the case of the compound (G) except that the polyolefin compound was changed to polypropylene (the number of atoms linearly linked to each other: about 20,000). In the case of the compound (H), the number of carbons was 5 to 7 for the most part thereof.

<Compound (I)>

A compound (I) was prepared in the same manner as in the case of the compound (A) except that the compound (7) was changed to the compound (8) wherein each $R^1$ is a hydrogen atom, and an amino group is linked to 2-position of the hexaazatrinaphtylene skeleton. The compound (I) had the structure same as the compound (4), and the number of carbons was 5 to 7 for the most part thereof.

<Compound (J)>

A compound (J) was prepared in the same manner as in the case of the compound (I) except that the compound (8) was changed to one represented by the above-mentioned general formula (8) wherein four $R^1$s are methyl groups linked to 8-, 9-, 14-, and 15-positions of the hexaazatrinaphtylene skeleton, respectively, and the other $R^1$ is a hydrogen atom. In the case of the compound (J), the number of carbons was 5 to 7 for the most part thereof.

<Compound (K)>

A compound (K) was prepared in the same manner as in the case of the compound (G) except that the compound (7) was changed to the compound (8) wherein each $R^1$ is a hydrogen atom, and an amino group is linked to 2-position of the hexaazatrinaphtylene skeleton. The compound (K) had the structure same as the compound (6), and the number of carbons was 5 to 7 for the most part thereof.

<Compound (L)>

As a compound (L), hexaazatrinaphenylene was prepared.

<Compound (M)>

As a compound (M), hexaazatrinaphtylene was prepared.

<Compound (N)>

As a compound (N), poly(3,4-ethylenedioxythiophene/styrenesulfonic acid) ("BAYTRON P CH800" manufactured by Bayer AG) was prepared.

2. Manufacture of Organic EL Device

In each of the following Examples and Comparative Examples, five organic EL devices were manufactured.

Example 1

Preparation of Hole Transport Layer Material

The compound (A) was prepared as a conductive polymer, and the compound (A) was dissolved in dichloroethane to obtain a hole transport layer material.

<Manufacture of Organic EL Device>

-1- First, an ITO electrode (that is, an anode) having an average thickness of 100 nm was formed on a transparent glass substrate having an average thickness of 0.5 mm by vacuum evaporation.

-2- Next, the hole transport layer material was applied onto the ITO electrode by a spin coating method, and was then dried.

Thereafter, the hole transport layer material was subjected to heat treatment at 150° C. for 20 minutes for drying to form a hole transport layer having an average thickness of 50 nm.

-3- Next, a 1.7 wt % xylene solution of poly[(9,9-dioctyl-2,7-divinylenefluorenyl)-alt-co(anthracene-9,10-diyl)] (weight average molecular weight: 200,000) was applied onto the hole transport layer by a spin coating method, and was then dried to form a light emitting layer having an average thickness of 50 nm.

-4- Next, 3,4,5-triphenyl-1,2,4-triazole was vacuum evaporated onto the light emitting layer to form an electron transport layer having an average thickness of 20 nm.

-5- Next, an AlLi electrode (that is, a cathode) having an average thickness of 300 nm was formed on the electron transport layer by vacuum evaporation.

-6- Next, these layers were covered with a protection cover made of polycarbonate and fixed and sealed with a UV curable resin to obtain an organic EL device.

Examples 2 to 11

In each of Examples 2 to 13, organic EL devices were manufactured in the same manner as in the Example 1 except that the compound (A) used as a conductive polymer was changed to the compounds (B) to (K), respectively, to prepare the hole transport layer material.

Comparative Example 1

Organic EL devices were manufactured in the same manner as in the Example 1 except that the preparation of the hole transport layer material was omitted but the hole transport layer was formed using the compound (L) by vacuum evaporation in the step -2-.

Comparative Example 2

Organic EL devices were manufactured in the same manner as in the Comparative Example 1 except that the compound (L) was changed to the compound (M).

Comparative Example 3

Preparation of Hole Transport Layer Material

The compound (M) was dispersed in water to prepare a 2.0 wt % water dispersion. In this way, a hole transport layer material was obtained.

It is to be noted that the compound (M) contained 3,4-ethylenedioxythiophene and styrenesulfonic acid in a weight ratio of 1:20.

<Manufacture of Organic EL Device>

Organic EL devices were manufactured in the same manner as in the Example 1 except that the hole transport layer material was changed to one obtained in this Comparative Example 3.

Comparative Example 4

Preparation of Hole Transport Layer Material

The compound (L), polyesteracrylate-based photocrosslinking agent ("Aronix M-8030", manufactured by Toa gosei Co., Ltd.), and a radical polymerization initiator ("Irgacure 651", manufactured, by NAGASE & CO., LTD.) were mixed with dichloroethane in a weight ratio of 30:65:5 to obtain a hole transport layer material.

<Manufacture of Organic EL Device>

Organic EL devices were manufactured in the same manner as in the Example 1 except that the step -2- for forming a hole transport layer was changed as follows. That is, the hole transport layer material prepared in the Comparative Example 3 was applied onto the ITO electrode by a spin coating method, and then the compound (N) was cross-linked (cured) with the polyesteracrylate-based photocrosslinking agent by irradiation with ultraviolet rays having a wave length of 185 nm and an irradiation intensity of 3 mW/cm$^2$ for 400 seconds in the atmosphere using a mercury lamp ("UM-452", manufactured by USHIO INC.) and a filter to form the hole transport layer.

Comparative Example 5

Organic EL devices were manufactured in the same manner as in the Comparative Example 4 except that the compound (L) was changed to the compound (M).

2. Evaluation

The luminous brightness (cd/m$^2$), the maximum light emitting efficiency (lm/W), and the time that elapsed before the luminous brightness reduced to half its initial value (that is, a half-life) of each of the organic EL devices of the Examples and the Comparative Examples were measured.

It is to be noted that each measurement value was an average value obtained by using the five organic EL devices.

When the luminous brightness was measured, a voltage of 6 V was applied across the ITO electrode and the AlLi electrode.

The luminous brightness, maximum light emitting efficiency, and half-life of each the Examples and Comparative Examples were compared to the measurement values of the Comparative Example 1, respectively, and were evaluated according to the following four criteria.

A: The measurement value was 1.50 times or more that of the Comparative Example 1.

B: The measurement value was 1.25 times or more but less than 1.50 times that of the Comparative Example 1.

C: The measurement value was 1.0 times or more but less than 1.25 times that of the Comparative Example 1.

D: The measurement value was 0.75 times or more but less than 1.00 times that of the Comparative Example 1.

These evaluation results are shown in the following Table 1.

TABLE 1

| | Conductive Polymer | Number of Carbons | Carrier Transport Structure | | Luminous Brightness (Relative Value) | Maximum Light Emitting Efficiency (Relative Value) | Half-life of Luminous Brightness (Relative Value) |
|---|---|---|---|---|---|---|---|
| | | | Main Skeleton | Substituent R$^1$ | | | |
| Example 1 | Compound (3) | 5 or 6 | Hexaazatriphenylene | H | A | A | A |
| Example 2 | Compound (3) | 8-10 | Hexaazatriphenylene | H | A | B | A |
| Example 3 | Compound (3) | 3 or 4 | Hexaazatriphenylene | H | A | B | A |
| Example 4 | Compound (3) | 11-13 | Hexaazatriphenylene | H | B | B | B |
| Example 5 | Compound (3) | 1 or 2 | Hexaazatriphenylene | H | B | B | B |
| Example 6 | Compound (3) | 5 or 6 | Hexaazatriphenylene | H, CH$_3$CH$_2$— | A | A | A |
| Example 7 | Compound (5) | 5 or 6 | Hexaazatriphenylene | H | A | A | A |
| Example 8 | Compound (5) | 5-7 | Hexaazatriphenylene | H | A | A | A |
| Example 9 | Compound (4) | 5-7 | Hexaazatriphtylene | H | A | A | A |
| Example 10 | Compound (4) | 5-7 | Hexaazatriphtylene | H, CH$_3$— | A | A | A |
| Example 11 | Compound (6) | 5-7 | Hexaazatriphtylene | H | A | A | A |
| Com. Ex. 1 | — | — | — | — | 1.00 | 1.00 | 1.00 |
| Com. Ex. 2 | — | — | — | — | C | C | C |
| Com. Ex. 3 | — | — | — | — | D | C | D |
| Com. Ex. 4 | — | — | — | — | C | C | C |
| Com. Ex. 5 | — | — | — | — | C | C | C |

As shown in FIG. 1, all the organic EL devices of the Examples 1 to 13 (that is, the organic EL devices provided with the hole transport layer mainly composed of the conductive polymer according to the present invention) were more excellent in luminous brightness, maximum light emitting efficiency, and half-life as compared to the organic EL devices of the Comparative Examples 1 to 3.

From the result, it is clear that in the organic EL device according to the present invention, the interaction between adjacent carrier transport structures is decreased appropriately and mutual dissolution between the hole transport layer and the light emitting layer is prevented appropriately.

In addition, it is also clear that a more appropriate interval between adjacent carrier transport structures provides more excellent luminous brightness, maximum light emitting efficiency, and half-life irrespective of difference in their carrier transport structures.

Finally, it is to be understood that the present invention is not limited to the Examples described above, and many changes or additions may be made without departing from the scope of the invention which is determined by the following claims.

The invention claimed is:

1. A conductive polymer comprising:
a linear main chain composed mainly of a saturated hydrocarbon,
a plurality of carrier transport structures which contribute to carrier transport and each of which is represented by the following general formula (1),
and a linking structure which branches off from the main chain to link each of the carrier transport structures to the main chain;

General Formula (1)

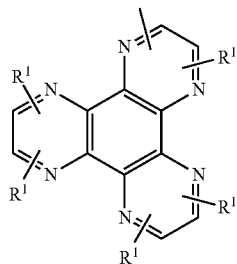

where each $R^1$ independently represents a hydrogen atom, a methyl group or an ethyl group, and the $R^1$s are the same or different,
wherein a number of carbon atoms linearly linked to each other to constitute the main chain existing between adjacent linking structures is 5 to 7,
and when the number of the carbon atoms linearly linked to each other to constitute the main chain existing between the adjacent linking structures is defined as "A" and a number of atoms linearly linked to each other in the linking structures is defined as "B," A and B satisfy the relation $1.5 \leqq A/B \leqq 10$.

2. A conductive polymer comprising:
a linear main chain composed mainly of a saturated hydrocarbon,
a plurality of carrier transport structures which contribute to carrier transport and each of which is represented by the following general formula (2),
and a linking structure which branches off from the main chain to link each of the carrier transport structures to the main chain;

General Formula (2)

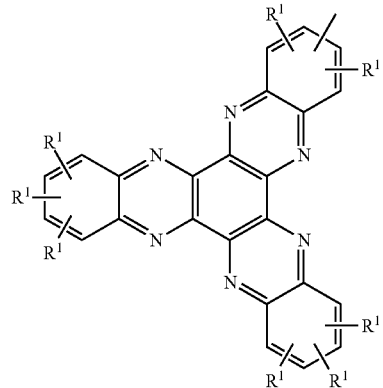

where each $R^1$ independently represents a hydrogen atom, a methyl group or an ethyl group, and the $R^1$s are the same or different,
wherein a number of carbon atoms linearly linked to each other to constitute the main chain existing between adjacent linking structures is 5 to 7,
and when the number of the carbon atoms linearly linked to each other to constitute the main chain existing between the adjacent linking structures is defined as "A" and a number of atoms linearly linked to each other in the linking structures is defined as "B," A and B satisfy the relation $1.5 \leqq A/B \leqq 10$.

3. The conductive polymer as claimed in claim 2, wherein each carrier transport structure has a benzene ring, and each linking structure is linked to the 2- or 3-position on the benzene ring.

4. The conductive polymer as claimed in claim 1, wherein A and B satisfy the relation $1.5 \leqq A/B \leqq 5$.

5. The conductive polymer as claimed in claim 1, wherein the number of atoms linearly linked to each other in each of the adjacent linking structures is substantially the same as to each other.

6. The conductive polymer as claimed in claim 1, wherein a number of carbon atoms linearly linked to each other to constitute the main chain is in the range of 100 to 30,000.

7. The conductive polymer as claimed in claim 1, wherein the main chain contains between the adjacent linking structures a side chain that branches off from the main chain and has a double bond.

8. The conductive polymer as claimed in claim 1, wherein the number of atoms linearly linked to each other to constitute each linking structure is 1 to 3.

9. The conductive polymer as claimed in claim 1, wherein each linking structure contains an amide bond.

10. A conductive layer formed using the conductive polymer as defined in claim 1.

11. The conductive layer as claimed in claim 10, wherein the conductive layer is formed by means of an application method.

12. The conductive layer as claimed in claim 10, wherein the conductive layer is a hole transport layer.

13. The conductive layer as claimed in claim 10, wherein the thickness of the conductive layer is in the range of 1 to 100 nm.

14. An electronic device comprising a laminated body which includes the conductive layer defined in claim 10.

15. The electronic device as claimed in claim 14, wherein the electronic device includes a light emitting device or a photoelectric transducer.

16. The electronic device as claimed in claim 15, wherein the light-emitting device includes an organic electroluminescent device.

17. Electronic equipment comprising the electronic device as claimed in claim 14.

* * * * *

UNITED STATES PATENT AND TRADEMARK OFFICE
CERTIFICATE OF CORRECTION

| | |
|---|---|
| PATENT NO. | : 7,879,970 B2 |
| APPLICATION NO. | : 11/794947 |
| DATED | : February 1, 2011 |
| INVENTOR(S) | : Masamitsu Uehara |

It is certified that error appears in the above-identified patent and that said Letters Patent is hereby corrected as shown below:

Title Page,
Please delete the following:

"(75) Inventor:   MasamItsu Uehara"

And replace with:

(75) Inventor:   Masamitsu Uehara

Signed and Sealed this
Tenth Day of May, 2011

David J. Kappos
*Director of the United States Patent and Trademark Office*